United States Patent
Xiao et al.

(10) Patent No.: US 8,377,576 B2
(45) Date of Patent: Feb. 19, 2013

(54) MAGNETIC COMPOSITES AND METHODS OF MAKING AND USING

(75) Inventors: T. Danny Xiao, Willington, CT (US); Xinqing Ma, Willington, CT (US); Heng Zhang, Storrs, CT (US); Junfeng Zhou, Mansfield Center, CT (US)

(73) Assignee: Inframat Corporation, Farmington, CT (US)

( * ) Notice: Subject to any disclaimer, the term of this patent is extended or adjusted under 35 U.S.C. 154(b) by 2006 days.

(21) Appl. No.: 11/432,086

(22) Filed: May 11, 2006

(65) Prior Publication Data
US 2007/0102663 A1 May 10, 2007

Related U.S. Application Data

(60) Provisional application No. 60/679,859, filed on May 11, 2005.

(51) Int. Cl.
*B32B 15/00* (2006.01)

(52) U.S. Cl. ..................... 428/692.1; 428/800

(58) Field of Classification Search .................. 429/492
See application file for complete search history.

(56) References Cited

U.S. PATENT DOCUMENTS

| | | | |
|---|---|---|---|
| 4,237,189 A * | 12/1980 | Deffeyes | 428/457 |
| 4,353,958 A | 10/1982 | Kita et al. | |
| 4,719,026 A | 1/1988 | Sher et al. | |
| 4,837,046 A | 6/1989 | Oishi et al. | |
| 4,911,957 A | 3/1990 | Oishi et al. | |
| 5,230,729 A | 7/1993 | McCandlish et al. | |
| 5,279,994 A | 1/1994 | Kerkar | |
| 5,460,704 A | 10/1995 | Davis | |
| 5,667,715 A * | 9/1997 | Foister | 252/62.52 |
| 5,667,716 A | 9/1997 | Ziolo et al. | |
| 5,851,568 A | 12/1998 | Huang | |
| 5,868,959 A | 2/1999 | Mayo et al. | |
| 5,933,116 A | 8/1999 | Suesada et al. | |
| 5,952,040 A | 9/1999 | Yadav et al. | |
| 6,045,925 A | 4/2000 | Klabunde et al. | |
| 6,048,920 A | 4/2000 | Ziolo et al. | |
| 6,162,530 A | 12/2000 | Xiao et al. | |
| 6,183,568 B1 | 2/2001 | Nakanishi et al. | |
| 6,228,904 B1 * | 5/2001 | Yadav et al. | 523/210 |
| 6,392,525 B1 | 5/2002 | Kato et al. | |
| 6,488,908 B1 | 12/2002 | Kawai et al. | |
| 6,632,473 B2 | 10/2003 | Kaneko et al. | |
| 6,709,966 B1 | 3/2004 | Hisatsune et al. | |
| 6,716,488 B2 | 4/2004 | Fleming et al. | |
| 6,720,074 B2 | 4/2004 | Zhang et al. | |
| 6,737,463 B2 * | 5/2004 | Yadav et al. | 524/435 |
| 6,753,033 B2 | 6/2004 | Hashimoto et al. | |

(Continued)

FOREIGN PATENT DOCUMENTS

| | | | |
|---|---|---|---|
| EP | 1050889 A2 | 8/2000 | |
| EP | 1050889 A2 | 11/2000 | |

OTHER PUBLICATIONS

G. Y. Chin, et al., "Soft Magnetic Metallic Materials", 1980, Chapter 2—pp. 60-188.

(Continued)

*Primary Examiner* — Mark Ruthkosky
*Assistant Examiner* — Gary Harris
(74) *Attorney, Agent, or Firm* — Cantor Colburn LLP

(57) ABSTRACT

Disclosed herein is a magnetic paste that generally includes a magnetic component and a liquid organic component. The magnetic component includes a plurality of discrete nanoparticles, a plurality of nanoparticle-containing assemblies, or both. Magnetic devices can be formed from the magnetic paste. Methods of making and using the magnetic paste are also described.

15 Claims, 8 Drawing Sheets

U.S. PATENT DOCUMENTS

| | | | |
|---|---|---|---|
| 6,831,543 B2 | 12/2004 | Mizoguchi et al. | |
| 2002/0193236 A1* | 12/2002 | Takaya et al. | 501/126 |
| 2003/0068496 A1* | 4/2003 | Wei et al. | 428/402 |
| 2003/0099762 A1 | 5/2003 | Zhang et al. | |
| 2003/0129405 A1 | 7/2003 | Zhang et al. | |
| 2003/0202234 A1 | 10/2003 | Taylor et al. | |
| 2004/0210289 A1* | 10/2004 | Wang et al. | 607/116 |

OTHER PUBLICATIONS

F.E. Luborsky, "Amorphous Ferromagnets", 1980, pp. 453-529.

Giselher Herzer, "Soft Magnetic Nanocrystalline Materials", 1995, pp. 1741-1756.

F. Petroff, et al., "Oscillatory interlayer exchange and magnetoresistance in Fe / Cu multilayers", Sep. 1, 1991, vol. 44 No. 10—pp. 5355-5357.

M.N. Baibich, et al., "Giant Magnetoresistance of (001) Cr. Magnetic Superlattices", Nov. 21, 1988, vol. 61 No. 21—pp. 2472-2475.

Eric E. Fullerton et al, "Roughness and Giant Magnetoresistance in Fe / Cr Superlattices", Feb. 10, 1992, vol. 68 No. 6—pp. 859-862.

W. P. Pratt, Jr. et al, "Perpendicular Giant Magnetoresistance of Ag / Co Multilayers", Jun. 10, 1991, vol. 66 No. 23—pp. 3060-3063.

John Q. Xiao, et al., "Giant Magnetoresistance in Nonmultilayer Magnetic System", Jun. 22, 1992, vol. 68 No. 25—pp. 3749-3752.

Masanori Abe, et al., "Ferrite-planting in Aqueous Solution: A new Method for Preparing Magnetic Thin Film", Jul. 23, 1983, vol. 22 No. 8 pp. L511-L513.

H. Glelter, "Materials With Ultrafine Microstructures: Retrospectives and Persoectives" NanoStructured Materials (1992) vol. 1 pp. 1-19.

A. Chatterjee, et al., "Glass-metal nanocomposite synthesis by metal organic route", J. Phys. D: Appl Phys. 22 (1989) pp. 1386-1392.

Elsevier Sequoia, "Magnetic and Biomagnetic Films Obtained by Ferrite Plating in Aqueous Solution", Thin Solid Films, 216 (1992), pp. 155-161.

M. Abe, et al. "Plating of Ferrite Film on 8" Disc at 70° C. by "Spray-Spin-Coating" Method", 1987, pp. 3432-3434.

Yutaka Shimada et al., "Study on Initial Permeability of Ni-Zn Ferrite Films Prepared by the Spin Spray Method", Journal of Magnetism and Magnetic Materials 278 (2004)—pp. 256-262.

Y. Kitamoto et al, "Co ferrite films with Excellent Perpendicular Magnetic Anisotropy and High Coercivity Deposited at Low Temperatures", American Institute of Physics (1999) vol. 85 No. 8—pp. 4708-4710.

T. Itoh et al, Light-enhanced ferrite plating of $Fe_3\_xMxO4$ )(M=Ni, Zn, Co and Mn) Films in an Aqueous Solution (invited) American Institute of Physics (1991)—pp. 5911-5914.

Seiichiro Hori et al, Maskless Patterning of Ferrite Film by selected Area Film Growth in Aqueous Solution by "Laser-Enhanced Ferrite Plating", Jpn J. Appl. Physics (1992) vol. 31—pp. 1185-1186.

P. C. Dorsey et al, "$CoFe_2O_4$ Thin Films Grown on (100) MgO Substrates Using Pulsed Laser Deposition", American Institute of Physics (1996), pp. 6338-6340.

Masanori Abe et al, "Ultrasound Enhanced Ferrite Plating; Bringing Breakthrough in Ferrite Coating Synthesized from Aqueous Solutions", Sep. 1997, vol. 33 No. 5—pp. 3649-3651.

C. M. Williams et al, "The magnetic and Structural Properties of Pulsed laser Deposited Epitaxial MnZn-Ferrite Films", Naval Research Laboratory, Washington DC (Oct. 1993), pp. 1676-1688.

P. Samarasekara et al, "Variable texture $NiOFe_2O_3$ Ferrite Films Prepared by Pulsed Laser Deposition", American Institute of Physics (1996), pp. 5425-5427.

S.K. Remillard et al, "Electrical deposition of Tl-Ba-Ca-Cu-O and $Bi_2Sr_2CaCu_2O_x$ Thick Films", Mar. 1991, pp. 345-350.

Y. Yamamoto et al, "Fine Grained Ferite for low Profile Transformer", IEEE Transactions on Magnetics (Sep. 1997) vol. 33 No. 5—pp. 3742-3744.

Mohammad Mansour Riahi-Kashani et al., "Permeability Evaluation of Ferrite Pastes, Epoxies and Substrates over a Wide Range of Frequencies", IEEE Dec. 1992, vol. 41 No. 6—pp. 1036-1040.

Riahi-Kashani et al, "Characterization of Ferromagnetic Materials for Microelectronics Applications over a Wide Range of Frequencies", IEEE Instrumentation and Measurement Technology Conference 1992, pp. 430-435.

M. Yamaguchi et al, "Magnetic thin-film inductors for RF-integrated Circuits", MMM 2000, pp. 807-810.

Toshiro Sato et al, "A Magnetic Thin Film Inductor and its Application to a MHz Switching dc-dc Converter", IEEE Mar. 1994, vol. 30 No. 2—pp. 217223.

C. Djega-Mariadassou et al. "High Field Magnetic Study of Small Fe Particles Dispersed in an Alumina Matrix" IEEE Sep. 1990, vol. 26 No. 5 pp. 1819-1821.

M. Paradavi Horvath et al. "Magnetic properties of copper-magnetite nanocomposites prepared by ball milling" American Institute of Physics 1993, pp. 6958-6960.

David E. Nikles et al, "Protection of Fe Pigments with Amine-Quinone Polymers" IEEE vol. 30 No. 6 Nov. 1994, pp. 4068-4070.

Diandra L. Leslie et al, "Self-stabalizing magnetic colloids: Ultrafine Co particles in polymers" American Institute of Physics 1996, pp. 5312-5314.

Jian-Ping Wang et al, "Preparation and magnetic properties of $Fe100\_xNix\_SiO2$ Granular Alloy Solid Using a Sol-Gel Method" MMM 1994, pp. L251-L256.

J. I. Gittleman et al, Superparamagnetism and Relaxation Effects in Granular $Ni\_SiO2$ and $Ni-Al2O3$ filma, Physical review B May 1, 1974, vol. 9 No. 9—pp. 2891-3898.

J. I. Gittleman et al, "Magnetic Properties of Granular Nickel Films", Physical Review B May 1, 1972, vol. 5 No. 9—pp. 3609-3622.

E. Paparazzo et al, "X-Ray Photoemission Study of $Fe-AI2O3$ Granular Thin Films", Physical Review B Jul. 15, 1980, vol. 28, No. 2 pp. 1154-1157.

A. Gavrin et al, "Fabrication and Magnetic Properties of Granular Alloys" AIP 1990, pp. 938-942.

G. A. Niklasson et al, "Optical properties and Solar Selectivity of Coevaporated $Co-AI2O3$ Composite Films", AIP 1984, pp. 3382-3410.

Martha Pardavi-Horvath et al, "Switching Field Distribution Changes During Reaction—Milling of Iron-Zinc Nanocomposites", IEEE Nov. 6, 1995, vol. 31 No. 6 pp. 3775-3777.

C. Laurent et al, "Magnetic Properties of Granular Co-polymer Thin Films", AIP 1989, pp. 2017-2020.

D. N. Lambeth et al, "Media for 10 Gb/in.2 Hard Disk Storage: Issues and Status (invited)", AIP 1996, pp. 4496-4501.

Hiroyasu Fujimori, "Structure and 100MHz Soft Magnetic Properties in Multilayers and CGranular Thin Films", Scripta Metallurgica et Materialia 1995, vol. 33 Nos. 10/11 pp. 1625-1636.

George T. Rado et al, "Magnetic Spectra of Ferrites" NRL, Washington D.C. Jan. 1953, vol. 25 No. 1 pp. 81-89.

George T. Rado et al, "On the Inertia of Oscillating Ferromagnetic Domain Walls", Physical Review SAug. 15, 1951, vol. 83 No. 4, pp. 821-826.

W. D. Jones, "Findamental Principles of Powder Metallurgy", London Edward Arnold Publishers 1960, pp. 658-659.

K. H. Kim et al, "The Magnetic Properties of Nanocrystalline Fe-Co (Cr)-Hf-N thin films" Journal od Applied Physics May 1, 2000, vol. 87 No. 9 pp. 5248-5250.

R. D. Shull et al, "Nanocomposite Magnetic Materials", Journal of Nanostructured Materials 1992.

Tongsan D. Xiao et al, "Microstructural Characteristics of Chemically Processed Manganese Oxide Nanopibers" Acta mater 1997, vol. 45 No. 4 pp. 1685-1693.

Ping Lou et al, "Synthesis of Chromium Silicide—Silicon Carbide Composite Powders" Materials Science Engineering B17 1993, pp. 126-130.

Tongsan D. Xiao et al , "Synthesis of Aluminum Nitride / Boron Nitride Composite Materials" J. Am. Ceram Soc. 76[4] 1993, pp. 987-992.

T.D. Xiao et al, "Synthesis of Si(N,C) Nanostructured Powders from an Organometallic Aerosol Using a Hot-Wall Reactor" Journal od Materials Science 28 1993, pp. 1334-1340.

P.R. Strutt et al, "Synthesis of polymerized Preceramic Nanoparticle Powders by Laser Irradiation of Metalorganic Precursors" NSM 1992, vol. 1 pp. 21-25.

T.D. Xiao et al, "synthesis of FexN/BN Magnetic Nanocomposite via Chemical Processing" NSM 1993, vol. 2 pp. 285-294.

Julian P. Partridge et al, "Laser-Assisted Chemical and Morphological Modification of metallic Substrates" SPIE 1986, vol. 669 pp. 150-160.

M. L. Lau et al, "Synthesis of Nanocrystalline M50 Steel Powders by Cryomilling" NSM 1996, vol. 7 No. 8 pp. 847-856.

C. G. Granqvist et al, "Ultrafine Metal Particles", JAP May 1976, vol. 47 No. 5 pp. 2200-2219.

J. Smit et al, "Ferrites" 1959.

Y. Hayakawa et al, "High Resistive Nanocrystalline Fe-M-O (M=Hf, Zr, rare-earth metals) Soft Magnetic Films for High-Frequency Applications (invited)", AIP Apr. 15, 1997, pp. 3747-3752.

Diandra L. Leslie-Pelecky et al, "Maagnetic Properties of Nanostructured Materials", Chem. Mater: 1996, pp. 1770-1783.

Anit K. Giri et al, "Coercivito of Fe SiO2 Nanocomposite Materials Prepared by Ball Milling", J. Appl, Phys 76(10) Nov. 15, 1994, pp. 6573-6575.

P. R. Strutt et al, "Synthesis of polymerized Preceramic Nanoparticle Powders by Laser Irradiation of Metalorganic Precursors" NSM 1992, vol. 1 pp. 21-25.

Y. D. Zhang et al, "Nanocomposite Co/SiO2 Soft Magnetic Materials", IEEE Jul. 4, 2001, vol. 37 No. 4 pp. 2275-2277.

H. Gleiter, "Materials with Ultrafine MicrostructuresL: Retrospectives and Perspectives" NSM 1992, vol. 1 pp. 1-19.

European Patent Office, PCT International Search Report, International Application No. PCT/US2006/018111, Date of Mailing: Nov. 22, 2006.

European Patent Office, PCT Written Opinion of the International Searching Authority, International Application No. PCT/US2006/018111, Date of Mailing: Nov. 22, 2006.

G. Herzer "Soft Magnetic Noncrystalline Materials" (1995) pp. 1741-1756; vol. 33; Nos. 10/11; Elsevier Science Ltd.; Acta Metallurgica Inc.

R.M. Bozorth, "Ferromagnetism" (1968) pp. 1-13; Chapter 1; D.Van Nostrand Company, Inc. Toronto, New York, London.

T. D. Xiao, et al. "Synthesis of Nanostructured Ni/Cr and Ni-Cr3C2 Powders by an Organic Solution Reaction Method" Nanostructured Materials (Nov. 22, 1996) pp. 857-871; vol. 7, Issue 8; pp. 857-871; Elsevier Science Ltd.

* cited by examiner

MAGNETIC COMPOSITES AND METHODS OF MAKING AND USING

CROSS REFERENCE TO RELATED APPLICATION

This application claims the benefit of U.S. Provisional Patent Application Ser. No. 60/679,859 filed May 11, 2005, which is incorporated herein by reference in its entirety.

STATEMENT REGARDING FEDERALLY SPONSORED RESEARCH

The United States Government has certain rights in this invention pursuant to National Science Foundation Grant Number DMI-0512262.

BACKGROUND

The present disclosure generally relates to magnetic composites and more specifically to magnetic pastes for use in high frequency applications.

The integration of magnetic components into electronic circuits has become a significant barrier to reducing the size of electronic devices. Current micrometer sized magnetic materials can only be used at low frequencies. For example, high permeability bulk ferrites can only be used at frequencies less than 1 megahertz (MHz) and bulk Ni-ferrites, which may be used up to about 100 MHz, have non-optimal initial permeabilities. Accordingly, existing commercial converters are designed to operate at frequencies less than about 2 MHz.

One method for integrating higher frequency magnetic devices into a circuit is through thick film screen-printing. Thick film screen-printing allows for the deposition of a magnetic material in paste form onto a ceramic substrate. The paste material generally consists of ceramic or metallic particles suspended in a polymer paste. Unfortunately, the permeabilities of these pastes are very low (e.g., less than about 3), resulting in large eddy current losses.

After printing, the paste undergoes a heat treatment that ultimately burns off the polymer and densifies, or sinters, the ceramic or metallic material. The result is a dense pattern formed from the ceramic or metallic material. Using this technique, for example, a conducting coil can be printed onto a layer of ferrite, and then covered with another layer of ferrite to form an inductive coil. Successive layers can be printed to increase the inductance of the device. The heat treatments, result in increased permeabilities, but are accompanied by increased eddy current losses at higher frequencies. Furthermore, the high temperature (about 700 to about 900 degrees Celsius) of the heat treatment makes these pastes incompatible with low temperature printed wiring board (PWB) or printed circuit board (PCB) processing procedures.

Accordingly, there remains a need in the art for new and improved magnetic pastes that have a desirable combination of properties, such as inductance, permeability, and/or permittivity at the desired frequency, and that may be used in devices that are processed at low temperatures.

BRIEF SUMMARY

A magnetic paste includes a magnetic component and a liquid organic component, wherein the magnetic component comprises a plurality of discrete nanoparticles, a plurality of nanoparticle-containing assemblies, wherein each assembly of the plurality of nanoparticle-containing assemblies has an average longest dimension of about 0.5 to about 150 micrometers, or both.

A magnetic device includes a magnetic component and a solid organic component, wherein the magnetic component comprises a plurality of discrete nanoparticles, a plurality of nanoparticle-containing assemblies, wherein each assembly of the plurality of nanoparticle-containing assemblies has an average longest dimension of about 0.5 to about 150 micrometers, or both.

A power converter includes a substrate, wherein the substrate comprises a printed circuit board, silicon wafer, or a ceramic material; and a film disposed on the substrate of the power converter, wherein the film comprises a magnetic component and a solid organic component, wherein the magnetic component comprises a plurality of discrete nanoparticles, a plurality of nanoparticle-containing assemblies, wherein each assembly of the plurality of nanoparticle-containing assemblies has an average longest dimension of about 0.5 to about 150 micrometers, or both.

A transformer includes a substrate, wherein the substrate comprises a printed circuit board, silicon wafer, or a ceramic material; and a film disposed on the substrate of the transformer, wherein the film comprises a magnetic component and a solid organic component, wherein the magnetic component comprises a plurality of discrete nanoparticles, a plurality of nanoparticle-containing assemblies, wherein each assembly of the plurality of nanoparticle-containing assemblies has an average longest dimension of about 0.5 to about 150 micrometers, or both.

An inductor includes a substrate, wherein the substrate comprises a printed circuit board, silicon wafer, or a ceramic material; and a film disposed on the substrate of the inductor, wherein the film comprises a magnetic component and a solid organic component, wherein the magnetic component comprises a plurality of discrete nanoparticles, a plurality of nanoparticle-containing assemblies, wherein each assembly of the plurality of nanoparticle-containing assemblies has an average longest dimension of about 0.5 to about 150 micrometers, or both.

A method for making a magnetic paste includes combining a magnetic component and a liquid organic component, wherein the magnetic component comprises a plurality of discrete nanoparticles, a plurality of nanoparticle-containing assemblies, wherein each assembly of the plurality of nanoparticle-containing assemblies has an average longest dimension of about 0.5 to about 150 micrometers, or both.

A method for making a magnetic device includes combining a magnetic component and a liquid organic component to form a paste, wherein the magnetic component comprises a plurality of discrete nanoparticles, a plurality of nanoparticle-containing assemblies, wherein each assembly of the plurality of nanoparticle-containing assemblies has an average longest dimension of about 0.5 to about 150 micrometers, or both; disposing the paste onto a substrate; and solidifying the paste.

The above described and other features are exemplified by the following figures and detailed description.

BRIEF DESCRIPTION OF THE DRAWINGS

Referring now to the figures, which are exemplary embodiments and wherein like elements are numbered alike.

DETAILED DESCRIPTION

Figure 2:
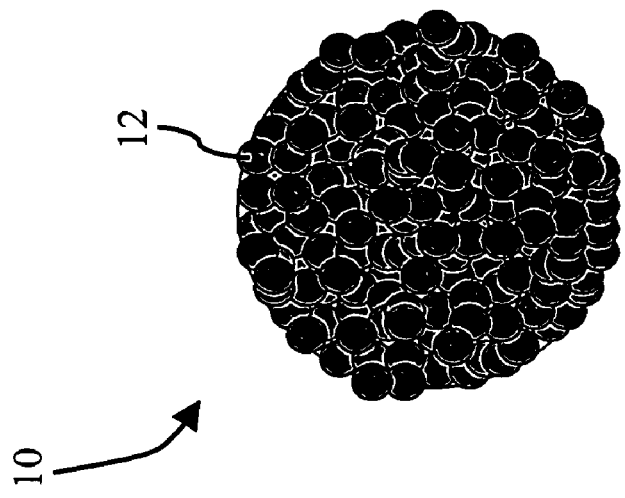
FIG. 2 is a schematic representation of a microscale particle assembly.

Magnetic nanocomposite pastes, methods of making and using the pastes, and devices comprising the magnetic nanocomposite pastes are described. In contrast to the prior art, the pastes, methods, and devices disclosed herein make use of discrete nanoparticles and/or assemblies of nanoparticles to form the paste. Advantageously, the use of a high temperature heat treatment to remove the organic component and to sinter (i.e., densify) the paste after it has been deposited onto a substrate is not necessary, and therefore the paste is compatible with, or may be used in, a printed wiring board (PWB)/printed circuit board (PCB) process. The term "nanoparticle", as used herein, refers to a particle having a grain dimension of less than about 250 nanometers (nm). The term "paste" as used herein, refers to non-solid compositions having a range of viscosities, and includes thick, viscous compositions as well as free-flowing compositions.

Also, as used herein, the terms "first", "second", and the like do not denote any order or importance, but rather are used to distinguish one element from another, and the terms "the", "a", and "an" do not denote a limitation of quantity, but rather denote the presence of at least one of the referenced item. Furthermore, all ranges directed to the same quantity of a given component or measurement are inclusive of the endpoints and independently combinable.

The magnetic paste generally comprises a liquid organic component and a magnetic component comprising a plurality of discrete nanoparticles and/or nanoparticle-containing assemblies. The liquid organic component may be an organic resin composition that is compatible with (i.e., does not substantially adversely affect the manufacture or processing of the compositions and articles described herein) both the magnetic component and the substrate onto which the paste will be disposed. The liquid organic component also has a viscosity that is sufficiently low to enable dispersal of the magnetic component, dispensing by the desired means, and flow (if desired) when disposed onto the substrate. Suitable liquid organic component compositions may accordingly comprise thermoplastic resins, thermosetting resins, or combinations thereof. In general, thermosetting compositions are useful because they are flowable prior to cure and solid after cure. Suitable resin compositions include thermoplastics such as polystyrenes, polyamides, polycarbonates, polyphenylene oxides, polysulfones, polyimides, and the like; and thermosets such as epoxies, polyurethanes, alkyds, diallyl phthalates, melamines, phenolics, polyesters, and silicones ethyl cellulose, benzocyclobutene (BCB), and the like. Combinations of different thermoplastic and/or thermosetting compositions may also be used. The liquid organic component may further comprise catalysts, initiators, promoters, crosslinkers, stabilizers, surfactants, dispersants, viscosity modifiers, and other additives or combinations of additives.

The nanoparticles generally comprise a magnetic metal (e.g., Fe, Ni, Cu, Mo, Co, Mn, Cr, Zn, alloys comprising at least one of the foregoing metals, and the like). For example, the nanoparticles may comprise the metal itself. Oxides, nitrides, or other multinary magnetic metal containing combinations may be used, for example iron oxide based compositions (e.g., ferrite), nitride based compositions (e.g., $Fe_3N$, $Fe_4N$, $Fe_{16}N_2$, and the like), or combinations comprising at least one of the foregoing (e.g., Ni-ferrite, Co-ferrite, Zn-ferrite, Ni—Zn-ferrite, Mn—Zn-ferrite, YIG-ferrite, and the like). Alternatively, the magnetic metal containing nanoparticles can individually be coated with an insulator, which may or may not have the same composition as the liquid organic component.

When discrete nanoparticles are used, they may be of any geometry. Desirably, they are spherical or substantially spherical to facilitate attaining high packing densities of the magnetic component within the paste. In an exemplary embodiment, the nanoparticle-nanoparticle separation within the paste is about 1 nm to about 100 nm.

When assemblies of nanoparticles are used, the assemblies also may be of any geometry; however they too are desirably spherical or substantially spherical to facilitate attaining high packing densities of the magnetic component within the paste. The average longest dimension of the assemblies may be about 0.5 to about 150 micrometers (μm).

Figure 1:
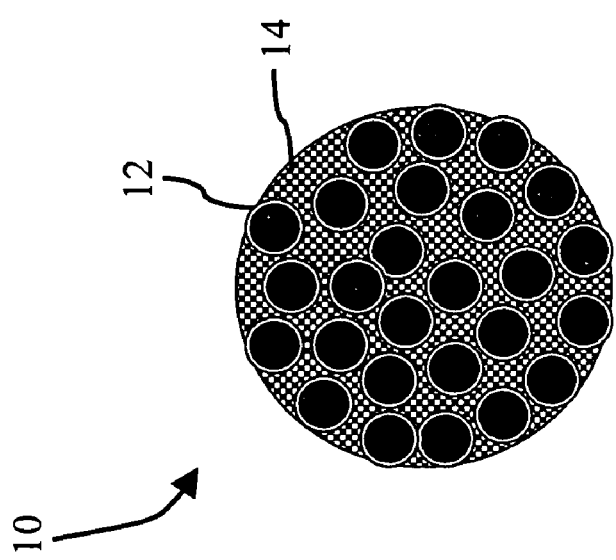
FIG. 1 is a schematic representation of a composite assembly.

In one embodiment, the assembly is itself a solid composite comprising a plurality of separate magnetic nanoparticles dispersed in an insulating matrix. An exemplary assembly 10 of this type is shown in FIG. 1 and fully described in commonly assigned U.S. Pat. No. 6,720,074, which is incorporated herein in its entirety. The individual nanoparticles 12 are dispersed such that the particle-particle separation is about 1 to about 100 nm. While inter-grain interactions between the immediate neighboring individual metallic nanoparticles 12 provide the desired magnetic properties, the insulating matrix 14 material provides high resistivity, which significantly reduces any eddy current loss. The particle size of these composite assemblies 10 is about 10 to about 50 micrometers (μm). Specifically, an average particle size for the composite assembles is about 30 μm.

Suitable insulating matrix 14 materials for the composite assembly 10 include high dielectric materials (i.e., dielectric constant greater than or equal to about 3) including amorphous or crystalline ceramics such as alumina, silica, zirconia, and the like, and high dielectric polymers and polymer composites. The insulating matrix material can be either a nonmagnetic or magnetic (such as a highly resistive ferrite) material. It is important to note that the insulating matrix material of this type of assembly 10 may have the same composition as the liquid organic component of the paste, except that it will already have been polymerized into a solid prior to disposal of the composite assembly 10 into the liquid organic component to form the paste. Examples of these composite assemblies 10 include $Co/SiO_2$, $Fe-Ni/SiO_2$, $Fe/SiO_2$, Co/polymer, and $Fe/NiFe_2O_4$.

In one embodiment, at least a portion of the magnetic nanoparticles are coated with an insulating composition (not shown) prior to being dispersed into the insulating matrix 14. The composition of the insulating coat may be different from the composition of the insulating matrix 14.

A method to manufacture the composite assembly 10 comprises fabricating a precomposite from a precursor composition; forming magnetic nanostructured particles surrounded by, or coated with, a matrix layer from the precomposite; and passivating the surface of the surrounded nanostructured particles.

In another embodiment, the assembly is a microscale particle comprising a plurality of agglomerated nanoparticles. For example, a plurality of nanoparticles can be sintered to form a microscale particle. An exemplary microscale particle assembly 15 is shown in FIG. 2. The nanoparticles 12 used to form the microscale particle assembly 15 can be highly resistive magnetic materials or highly conductive magnetic materials. In addition, the nanoparticles 12 can be of the same or different compositions. The particle size of the microscale particle assembly 15 is about 0.5 to about 150 micrometers (µm).

In one embodiment, the microscale particle assemblies 15 (e.g., microscale particles comprising a plurality of sintered nanoparticles) are formed by mixing magnetic nanoparticles and/or nanocomposites with a polymeric binder in solution, ball milling the solution mixture to form a uniform slurry, agglomerating the nanoparticles from the slurry to form microscale particles, and plasma densifying the microscale particles. The process may further comprise separating the microscale particles by their size prior to the plasma densification. Making the paste comprises mixing the densified microscale particles with the liquid organic component.

Suitable organic binders for mixing the starting materials (i.e., the nanoparticles and/or nanocomposites) include commercially available polyvinyl alcohol (PVA), polyvinylpyrrolidone (PVP), carboxymethyl cellulose (CMC), or other water soluble polymeric binders. The binder comprises about 0.5 to about 10 weight percent (wt %) of the total solution. More specifically, the binder comprises about 1 to about 5 wt % of the total solution. The balance of the solution is desirably deionized distilled water (DD water).

After sufficient mixing, the mixture is then ball milled, for example in a high-energy attrition mill, to "de-agglomerate" the particles and form a uniform slurry. The parameters that may be optimized during ball milling include the ball milling energy, time, and loading ratio of balls to powder to lubricant. These parameters may be readily determined by those skilled in the art in view of this disclosure without undue experimentation.

Depending on the desired characteristics of the final agglomerated or reconstituted microscale particles, a surfactant may also be added to the solution during ball milling to homogenize the dispersed nanoparticles in the slurry. The parameters to consider for optimization with respect to the surfactant include the solid ratio, solvent loading, and rheology of the slurry. Similarly, these parameters may be readily determined by those skilled in the art in view of this disclosure without undue experimentation.

Once a suitable slurry has been formed, the next step is the agglomeration or reconstitution of the individual nanoparticles into microscale particles wherein each microscale particle is an assembly of individual nanoparticles that are adhered by the organic binder. This may be accomplished using a spray drying process. The parameters to consider for optimization of the agglomeration process include slurry concentration, slurry delivery rate, drying temperature, and atomizing speed. These parameters also may be readily determined by those skilled in the art in view of this disclosure without undue experimentation.

During the spray drying process, agglomerated powders of different may be isolated by size range. In one embodiment, this is accomplished by using chamber and cyclone collectors. The chamber collects particles larger than about 15 micrometers through gravitational fall out. The cyclone collects fine particles (e.g., smaller than about 15 micrometers), which are carried by the hot gas that dries the slurry.

The reconstituted microscale powder is then densified by a flash sintering process. The flash sintering process burns-off the organic binder, sinters and/or melts the microscale particles to form dense bodies, and quenches the sintered and/or molten droplets for powder collection, all very rapidly. The densification should permit a rapid sintering followed by rapid quenching so as not to allow any particle growth.

The flash sintering process can be accomplished using any localized high energy heating source, such as a plasma torch (air plasma, microwave plasma, inductive plasma), or high velocity oxygen fuel (HVOF) torch. The agglomerated particles larger than about 1 µm collected by the cyclone or chamber collectors may be directly fed into an industrial plasma or HVOF feeder. However, particles smaller than about 1 µm require an additional feeding technique. In one embodiment, agglomerated particles of about 0.5 to about 1 µm are dispersed into DD water to form another slurry, which may then be fed into a plasma or HVOF torch directly via a liquid feeder. In this manner, water molecules rapidly evaporate and further heating of the solid results in the rapid sintering and/or melting of the particles into spherical droplets that are subjected to rapid quenching. As previously discussed, the particle size of the microscale particles are about 0.5 to about 150 µm.

In another embodiment, the microscale particle assemblies 15 are formed by fabricating a precursor composition, forming a spherical hydroxide from the precursor composition, converting the spherical hydroxide into a magnetic nanoparticle, and sintering a plurality of nanoparticles into densely packed microscale particles. Making the paste subsequently comprises mixing the densified microscale particles with the liquid organic component. This process is described in commonly assigned U.S. Pat. No. 6,162,530, which is incorporated herein in its entirety.

Fabricating the precursor composition comprises dissolving desired stoichiometric ratios of starting materials (e.g., metal salts) in DD water. Forming the spherical hydroxide comprises atomizing the precursor composition and a solution of a dilute hydroxide (e.g., $NH_4OH$). Adding a controlled amount of solid seed material will result in the formation of nucleation centers for spherical particle growth at elevated temperatures. This is followed by the sintering step to form the desired final microscale product. These densely packed hydroxide microscale particles are then washed and filtered to obtain dry powders. Depending on the gaseous environment used in the heat treatment, particles of either metallic, metal/insulator nanocomposite, or ferrite can be formed. The parameters to consider for optimization are heating rate, dwell time, and cooling time. These parameters may be readily determined by those skilled in the art in view of this disclosure without undue experimentation.

Once the discrete nanoparticles and/or assemblies of nanoparticles have been formed the paste may formed. In one embodiment, formation of the paste comprises dispersal of the magnetic component (i.e., the plurality of discrete nanoparticles and/or the plurality of nanoparticle assemblies) into the liquid organic component followed by mixing for a sufficient period of time to form a uniform composite.

Isolated individual nanoparticles possess undesirable magnetic properties, owing to the high magnetic anisotropy of the individual particles. However, reducing the separation between neighboring nanoparticles down to the nanoscale leads to novel magnetic coupling phenomena resulting in higher permeability and lower magnetic anisotropy. Without being bound by theory, this enhancement in permeability is due to the inter-particle exchange coupling effect. The exchange interaction, which leads to magnetic ordering within a grain or assembly, extends out to neighboring environments (through either a spin polarization or super-exchange interaction mechanism) within a characteristic distance. The exchange interaction in the assembly also leads to a cancellation of magnetic anisotropy of the individual particles and a demagnetizing effect, leading to significantly superior magnetic properties. By choosing a system with high tunneling excitation energy, a huge increase in the resistivity can be achieved through the technique wherein formation of the assemblies of nanoparticles prior to their addition into a liquid organic component to form the paste occurs. Because of the nanoscale particles, the eddy currents produced within the assembly are also negligibly small, leading to much lower eddy current loss for closely packed discrete nanoparticles and/or assemblies of nanoparticles compared to that of existing microscale materials.

The pastes disclosed herein comprise greater than or equal to 40 volume percent (vol %) of the magnetic component. Specifically, the pastes comprise about 40 to about 92 vol % magnetic component and about 8 to about 60 vol % liquid organic component. Furthermore, the each assembly of the magnetic component may have a packing density greater than or equal to about 90% of the theoretical density.

Figure 3:
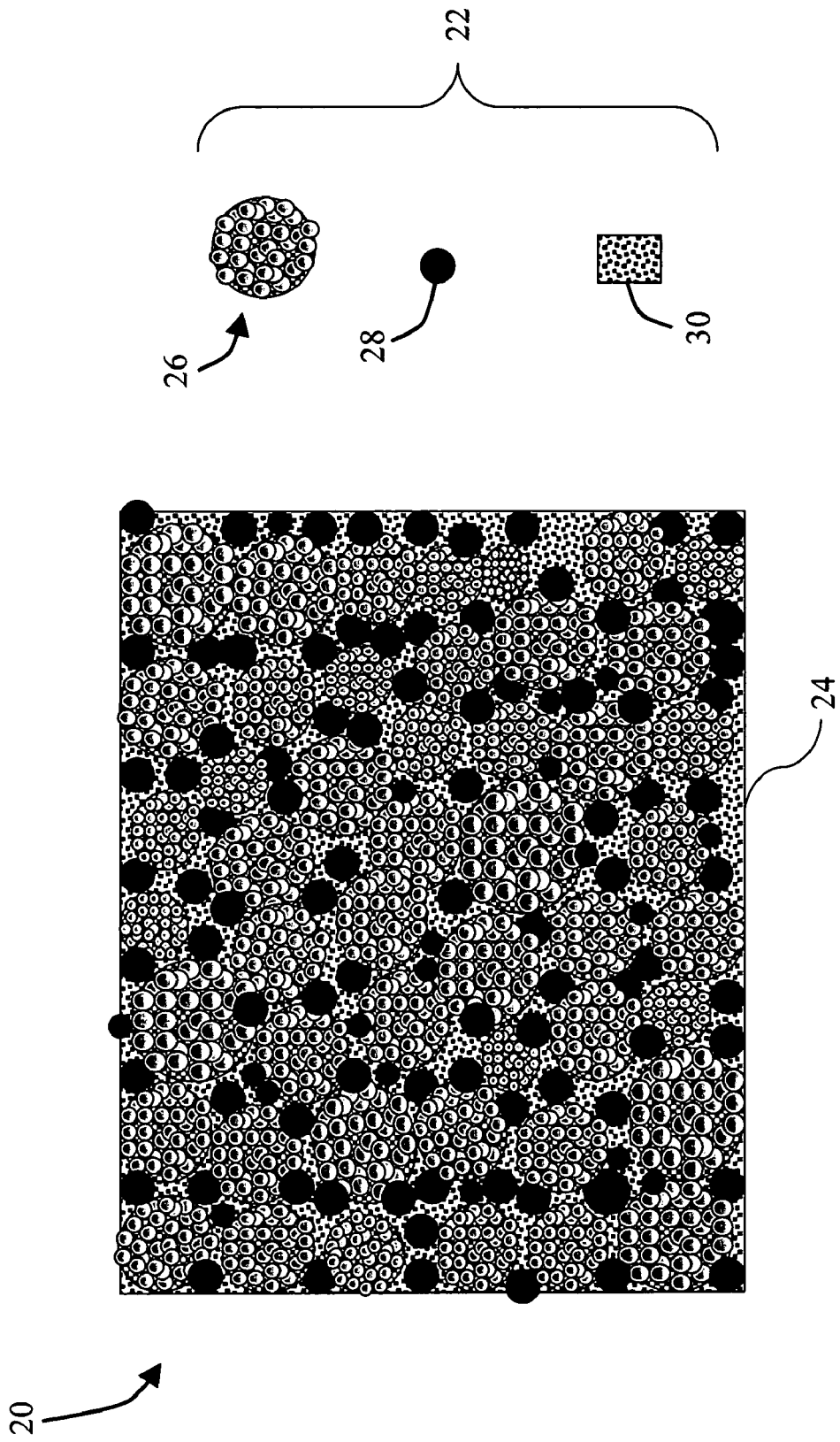
FIG. 3 is a schematic representation of a magnetic paste with a multi-modal magnetic component.

In one embodiment, the magnetic component is multimodal (i.e., the magnetic component can comprise two or more different sized groups of agglomerates or discrete nanoparticles). An exemplary magnetic paste 20 with a multimodal magnetic component 22 in the liquid organic component 24 is shown in FIG. 3. The magnetic component comprises microscale assemblies of three different sizes 26, 28, and 30. The arrangement of these three particle size groups will be in such a way that the first group 26 comprising the largest particles will form the main body of the magnetic component. The second group 28 will fill the voids or interstices that are left vacant by the close packing of the particles of the first group 26. Finally, the third group 30 will fill the voids or interstices that are left vacant by the close packing of the particles of the first group 26 and the second group 28. The ratio of the size of the particles of the third group 30 to the size of the particles of the second group 28 is about 0.1:1 to about 0.8:1. Similarly, the ratio of the size of the particles of the second group 28 to the size of the particles of the first group 26 is about 0.1:1 to about 0.8:1. In this manner, a considerably greater volume percent and/or packing density of the magnetic component may be achieved than for pastes comprising uniformly sized assemblies 10.

Once the paste is formed, it can readily be deposited onto a substrate using known deposition or lithography techniques. For example, in one embodiment, the paste is screen printed onto the substrate. In another embodiment, the paste is inkjetted onto the substrate as tiny droplets.

Subsequent to depositing the paste onto the substrate, the liquid organic component of the paste may be cured, for example crosslinked, to form a magnetic device. The cure can be accomplished using methods suitable for the chosen resin, for example, in the presence of a catalyst, heat or radiation, for example infrared, ultraviolet or e-beam radiation. Combinations of cure mechanisms may also be used. If heat is used, it is particularly desirable for the temperature not to exceed a temperature at which the substrate is substantially adversely affected (e.g., melts, decomposes, pyrolyzes, and the like).

The pastes may be employed in numerous applications that require a magnetic device. The pastes may be deposited on PWBs/PCBs, silicon wafers, ceramic substrate materials, or the like. Suitable applications include antennae, power converters or switching power supplies (e.g., DC-DC converters), inductors, magnetic filters or noise filters, radiofrequency (RF) components (e.g., radiofrequency identification tags or transponders), microwave and millimeter wave circulators, broadband devices, electronic sensors, cellular phones, cable televisions (CATV), radar devices, sensors, telemetry devices, implantable medical devices, and the like. The cured or hardened pastes can replace the bulky donut-shaped and/or E-shaped inductors used in existing high-frequency applications.

Advantageously, the devices formed from the magnetic pastes disclosed herein have permeabilities greater than or equal to about 3, and even greater than or equal to 10, at frequencies greater than or equal to about 1 megaHertz. The devices formed from the magnetic pastes also have permitivities greater than or equal to about 3, and even greater than or equal to 10, and/or inductances greater than or equal to about 0.4 microHenry (µ-Henry), and even greater than or equal to about 1 µ-Henry, at frequencies greater than or equal to about 1 megaHertz. In addition, the devices formed from the magnetic pastes also have inductances that are at least two times, and even up to at least five times, higher than a device without the magnetic component such as a bare inductor (e.g., bare copper coil).

The disclosure is further illustrated by the following non-limiting examples.

EXAMPLE 1

Formation of a Microscale Particle Assembly 10 pounds (lbs) of nickel-zinc ferrite $(Ni_{0.5}Zn_{0.5})Fe_2O_4$ with a grain size of less than about 100 nm were blended with 45.4 grams (g) of a 10 weight percent (wt %) solution of PVA in deionized distilled water (DD water) and dispersed into DD water to form a mixture that was ball milled to obtain a homogeneous slurry. The ball milling was performed using a Union Process Stegvari Attritor System type 18 with a ball/powder-loading ratio of about 4:1, ball milling speed of 300 revolutions per minute (rpm), and time of 1 h.

The formed slurry was then spray dried to form agglomerated substantially spherical particles. Spray drying parameters included a feeding rate of 600 g/min, an inlet temperature of 475 degrees Fahrenheit (° F.), and outlet temperature of 125 degrees Celsius (° C.). Powders were collected using chamber and cyclone ports. The total powder collected at the chamber was about 6.5 lbs with about 2.5 lbs collected at the cyclone.

Next, these powders were fed into a plasma torch (Metco 9 MB thermal spray device) for sintering into the densified assemblies. The plasma spray process parameters included using Argon as the primary plasma working gas flowing at about 80-120 standard cubic feet per hour (SCFH), a plasma power of 25-45 KW and a powder feeding rate of about 2-5 lbs/hr). In the plasma densification process, powders were fed into a plasma torch via a powder injection port, subsequently heated to remove any organic binders, followed by rapid melting/sintering/quenching of these liquid droplets from over 2000° C. to room temperature in a few milliseconds. The resulting assemblies formed from spray dried powders collected from the cyclone (less than about 20 μm) and chamber (about 20 to about 80 μm) ports are listed in Table 1

TABLE 1

Densification power levels and tapping densities of assemblies

| Trial | Plasma power | Tapping density |
|---|---|---|
| Plasma densification of chamber powders | | |
| 1 | 36 KW | 3.07 |
| 2 | 42 KW | 3.0 |
| Plasma densification of cyclone powders | | |
| 3 | 27.5 KW | 2.45 |
| 3 | 27.5 KW | 2.57 |
| 4 | 36 KW | 2.86 |
| 5 | 27.5 KW | 2.96 |
| 6 | 36 KW | 2.94 |

EXAMPLE 2

Fabrication of a Magnetic Paste

About 26 g of a plasma densified cyclone collected $(Ni_{0.5}Zn_{0.5})Fe_2O_4$ power having a tapping density of 2.94 was hand mixed with 4.27 g of epoxy resin (ETC 30-3019R CLR obtained from Epoxies, ETC) in a beaker using a spatula for about 0.5 hours until a uniform paste was formed. The paste composition was 14.1 wt % epoxy with 85.9 wt % $(Ni_{0.5}Zn_{0.5})Fe_2O_4$.

Similarly, about 20 g of plasma densified cyclone collected $(Ni_{0.5}Zn_{0.5})Fe_2O_4$ powder having a tapping density of 2.94 was hand mixed with 23.5 g of Cat 105 (Epoxies, ETC) by hand mixing in a beaker using a spatula. It should be noted that the Cat 105 is used to initiate the hardening of the epoxy resin (ETC 30-3019CLR) described above under thermal heating during device fabrication, by mixing approximately 16 parts by wt of paste formed in Cat 105 with 100 parts by wt of the paste formed with the ETC 30-3019R CLR resin.

Different ratios of epoxy to ferrite were tried, and the resulting properties of films formed from various pastes are listed in Table 2.

TABLE 2

Properties of films formed from magnetic paste

| Trials | Tapping density (g/cc) | Particle size (μm) | Ferrite loading wt % | Inductance (μ-Henry) |
|---|---|---|---|---|
| Cyclone 1 | 2.453 | 2–10 | 75 | 0.40 |
| Cyclone 2 | 2.453 | 2–10 | 80 | 0.50 |
| Cyclone 3 | 2.8 | 2–10 | 84 | 0.675 |
| Cyclone 4 | 2.57 | 2–10 | 85 | 0.655 |
| Cyclone 5 | 2.96 | 2–10 | 86.5 | 0.70 |
| Cyclone 6 | 2.94 | 2–10 | 84.75 | 0.75 |

It is noted that pastes having higher ferrite loadings were associated with higher tapping densities of the powders and also resulted in higher inductance values for fabricated films as will be further illustrated below.

EXAMPLE 3

Fabrication of a Multi-modal Magnetic Paste

About 29 g of chamber collected $(Ni_{0.5}Zn_{0.5})Fe_2O_4$ powder having average particle size of about 30 micrometers were mixed with 9.45 g of cyclone $(Ni_{0.5}Zn_{0.5})Fe_2O_4$ powders having an average particle size of about 3 micrometers. This powder mixture was then hand mixed with 2.8 g of epoxy resin (ETC 30-3019R CLR from Epoxies, ETC) in a beaker using a spatula for about 0.5 hours until a uniform paste was formed. The paste composition was 11.8 wt % epoxy with 88.2 wt % $(Ni_{50}Zn_{50})Fe_2O_4$ loading.

Similarly, about 10 g of chamber collected $(Ni_{0.5}Zn_{0.5})Fe_2O_4$ powder having an average particle size of about 30 micrometers were mixed with 3.75 g of cyclone collected $(Ni_{0.5}Zn_{0.5})Fe_2O_4$ powders having an average particle size of about 3 micrometers. This powder mixture was then hand mixed with 1.9 grams of Cat 105 (Epoxies, ETC) by in a beaker using a spatula. The paste composition was 12 wt % Cat 105 with 88 wt % $(Ni_{0.5}Zn_{0.5})Fe_2O_4$ loading. Again the Cat 105 is used to initiate the hardening of the epoxy resin (ETC 30-3019R CLR) under thermal heating during film fabrication, by mixing approximately 16 parts by weight of paste formed in Cat 105 with 100 parts by weight of the paste formed with ETC 30-3019R CLR.

EXAMPLE 4

Characterization of a Multi-modal Magnetic Paste

Figure 5:
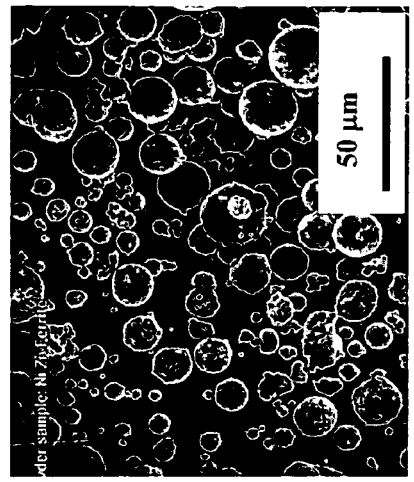
FIG. 5 is a scanning electron microscope (SEM) image showing a plurality substantially spherical, spray dried $(Ni_{0.5}Zn_{0.5})Fe_2O_4$ agglomerates.
Figure 6:
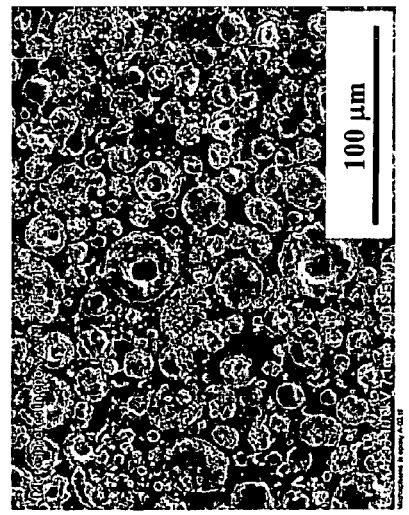
FIG. 6 depicts a representative cross-sectional image of a multi-modal paste after hardening.
Figure 4:
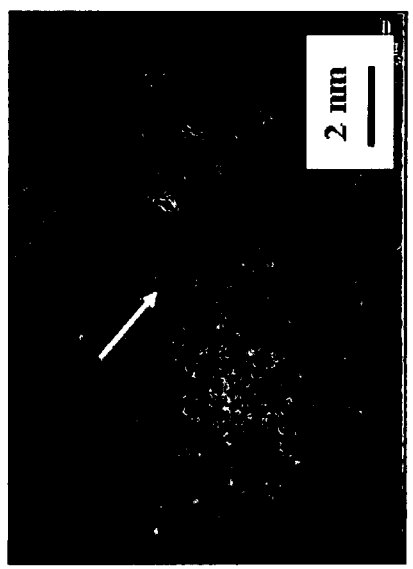
FIG. 4 is a high resolution transmission electron microscope (TEM) image of a plurality of $(Ni_{0.5}Zn_{0.5})Fe_2O_4$ grains prior to agglomeration.

Various multi-modal magnetic pastes of $(Ni_{0.5}Zn_{0.5})Fe_2O_4$ was fabricated and characterized. FIG. 4 is a high resolution transmission electron microscope (TEM) image of the original nickel-zinc ferrite before agglomeration. As indicated in the micrograph, the average grain size is less than about 10 nm. For illustrative purposes, the arrow points to a grain boundary of two adjacent grains. Spray drying a slurry of the $(Ni_{0.5}Zn_{0.5})Fe_2O_4$ produced substantially spherical agglomerates, as illustrated in the scanning electron microscope (SEM) image shown in FIG. 5. Agglomerates, each formed of a plurality of individual $(Ni_{0.5}Zn_{0.5})Fe_2O_4$ grains, of various sizes were combined with an epoxy resin as described above to form densely packed pastes. A representative cross-sectional image of a multi-modal paste after curing of the epoxy is shown in the SEM image of FIG. 6.

The quality and/or the magnetic performance of the paste could be tailored by varying the loading of the magnetic particles. For example, tapping densities of about 2 g/cc to about 4 g/cc were observed by using different mixtures of agglomerates.

Figure 7:
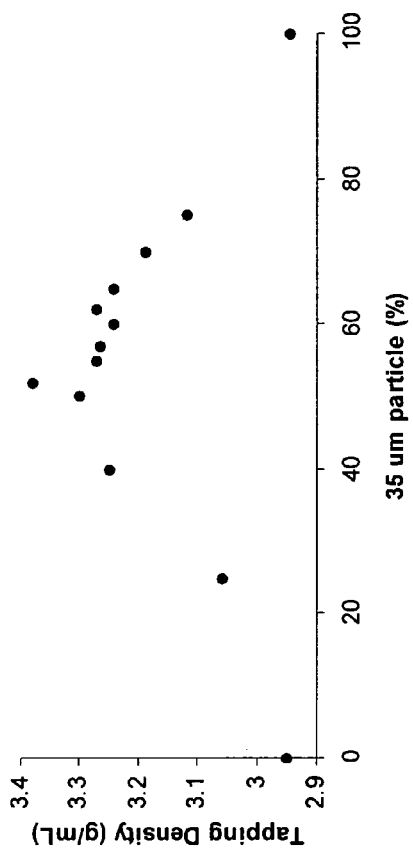
FIG. 7 is a graphical representation of the tapping density of pastes having different ratios of 10 and 35 micrometer $(Ni_{0.5}Zn_{0.5})Fe_2O_4$ agglomerates.

FIG. 7 highlights the variance in tapping density for so-called "bimodal" pastes made from different ratios of 35 micrometer and 2 micrometer sized agglomerates. As seen in the graph, the highest tapping densities were obtained for samples having about 40 wt % to about 60 wt %, and more specifically about 50 wt %, of the 35 μm agglomerates.

Figure 8:
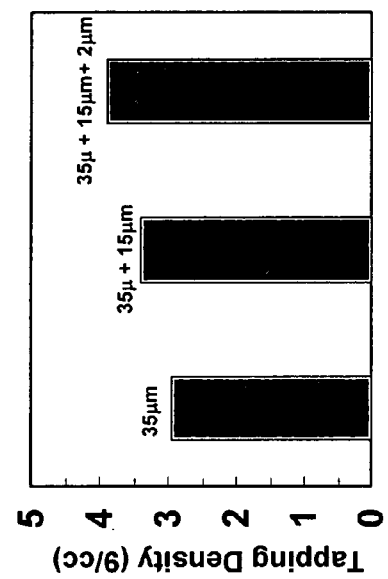
FIG. 8 is a graphical representation of the tapping density of pastes having one, two, and three groups of agglomerates.

Analogously, when three different sized agglomerates were used to make pastes, an increased tapping density was observed. FIG. 8 illustrates the observed change in tapping density for unimodal, bimodal, and trimodal pastes. As indicated in the graph, a tapping density of about 4 g/cc, which represents about 80% of the theoretical density, was achieved for the trimodal paste.

By extension of the data in FIGS. 7 and 8, it should be understood that the use of additional groups of agglomerates and/or or different ratios of the groups of agglomerates can be used to increase the tapping density as would be desired for a particular application. The tapping densities of various $(Ni_{0.5}Zn_{0.5})Fe_2O_4$ agglomerates are shown in Table 3.

TABLE 3

Tapping densities for different sized $(Ni_{0.5}Zn_{0.5})Fe_2O_4$ agglomerates

| | Agglomerate Size (μm) | | | |
|---|---|---|---|---|
| | 2 | 10 | 35 | 40 |
| Tapping density (g/cc) | 2.157 | 2.948 | 2.946 | 2.897 |

EXAMPLE 5

Formation of an Inductor Using a Multimodal Paste

Figure 9:
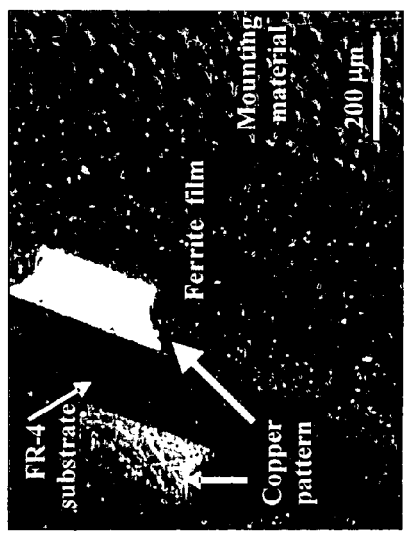
FIG. 9 is a representative optical microscope image of an inductor formed using a multimodal paste.

Several inductors were formed by screen-printing a multimodal paste of $(Ni_{0.5}Zn_{0.5})Fe_2O_4$ onto a FR-4 (i.e., fire-resistant, woven glass reinforced epoxy) printed circuit board. Pastes having ferrite loadings of about 80 to about 90 wt %, with the balance being an epoxy binder, were used. FIG. 9 is a representative optical microscope image of an inductor, and illustrates the positional relationship between the substrate, thick film of $(Ni_{0.5}Zn_{0.5})Fe_2O_4$, and the copper coil. Among the inductors that were fabricated, the bonding between the film and the patterned structure was excellent, and no delamination of the film from the substrate was observed.

Figure 10:
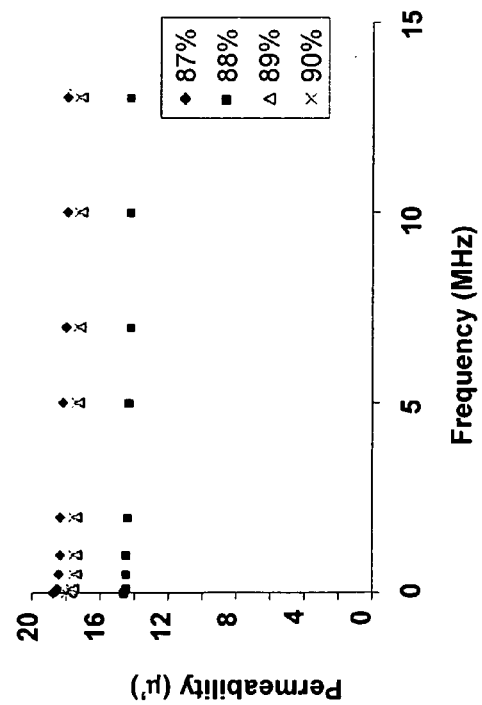
FIG. 10 is a graphical representation of the permeability as a function of frequency for four samples having different $(Ni_{0.5}Zn_{0.5})Fe_2O_4$ loading levels.

The permeability of each inductor was measured from about 10 kHz to about 13 MHz. FIG. 10 illustrates the permeabilities of four samples made from pastes having from about 87 wt % to about 90 wt % ferrite. A permeability of about 19 was obtained. It should be emphasized that for each sample, the eddy current losses were quite small, and the Q factor was greater than about 70 throughout the entire frequency range.

The inductance of each sample was also measured. The uncoated (i.e., before screen printing and hardening of the $(Ni_{0.5}Zn_{0.5})Fe_2O_4$ magnetic paste) patterned copper coil had an inductance of 0.183 μ-Henry for a 5 mm diameter, 100 micrometer thick coil at the measured frequency. After an approximately 1 mm thick magnetic paste was screened and hardened onto the copper coil, the inductance increased to greater than 1 μ-Henry.

Figure 12:
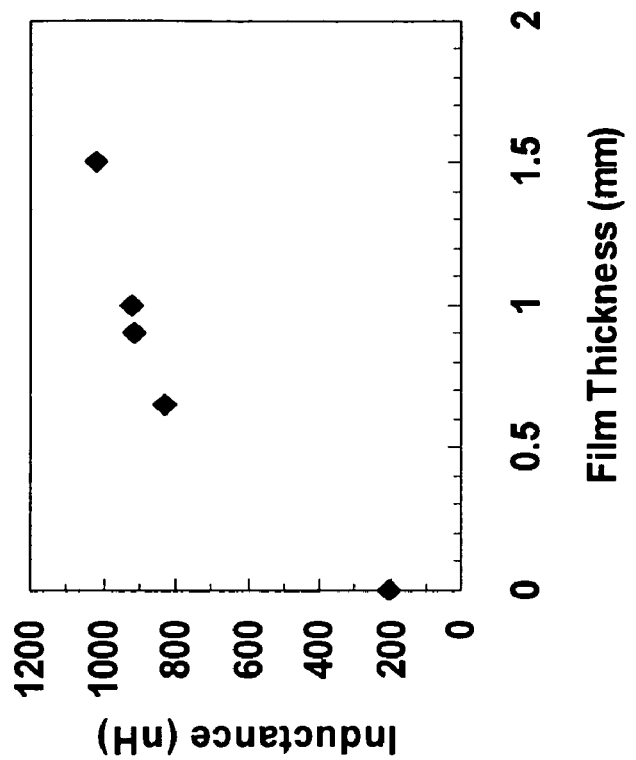
FIG. 12 is a graphical representation of the inductance as a function of film thickness for $(Ni_{0.5}Zn_{0.5})Fe_2O_4$ coated copper coils.
Figure 11:
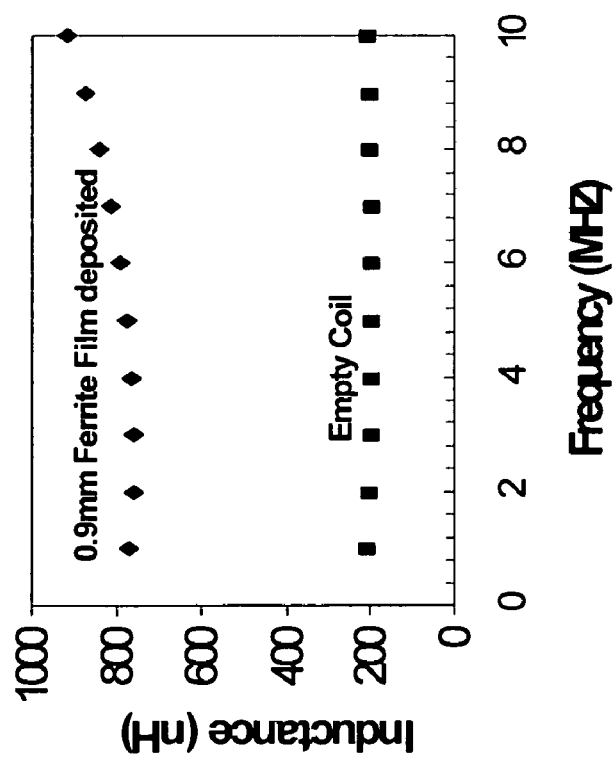
FIG. 11 is a graphical representation of the inductance as a function of frequency for a bare copper coil and for an inductor.
Figure 13:
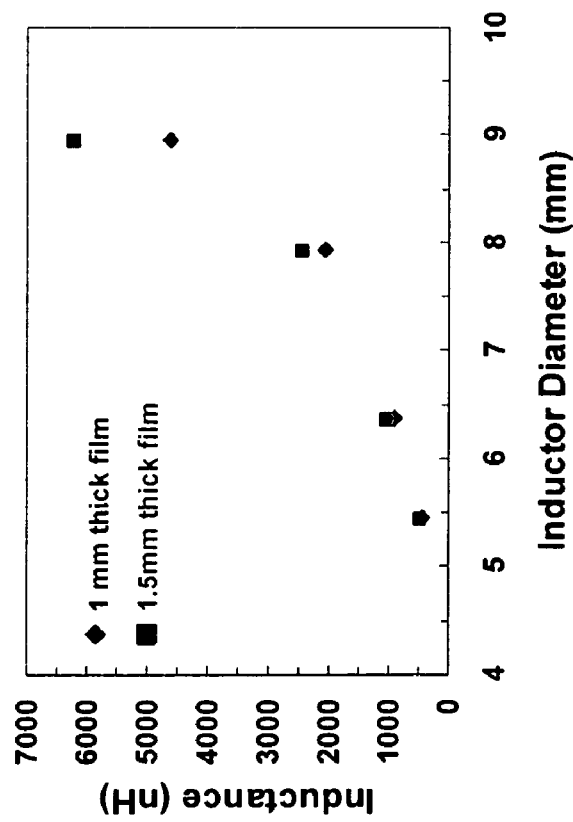
FIG. 13 is a graphical representation of the inductance as a function of diameter for 1 millimeter and 1.5 millimeter thick $(Ni_{0.5}Zn_{0.5})Fe_2O_4$ films deposited on copper coils.

FIG. 11 illustrates the inductance as a function of frequency for about 0.9 mm thick $(Ni_{0.5}Zn_{0.5})Fe_2O_4$ film deposited on the coil. As illustrated in the graph, a fourfold increase, from about 200 nanoHenry to about 800-1000 nanoHenry, was observed upon deposition of the ferrite coating. FIG. 12 illustrates the inductance as a function of film thickness for a given coil. As seen in the graph, the inductance increases dramatically with film thickness up to about 1 mm. Finally, FIG. 13 illustrates the inductance as a function of overall inductor diameter for both 1 mm and 1.5 mm thick films.

In applications such as switch power supplies for cell phones, the required inductance is about 1 microHenry at 5 MHz. Thus, from the data in FIGS. 11-13, a film thickness of about 1 mm using the pastes disclosed herein would be sufficient to achieve the desired inductance.

EXAMPLE 6

Fabrication of a Magnetic Paste from Discrete Nanoparticles

Figure 14:
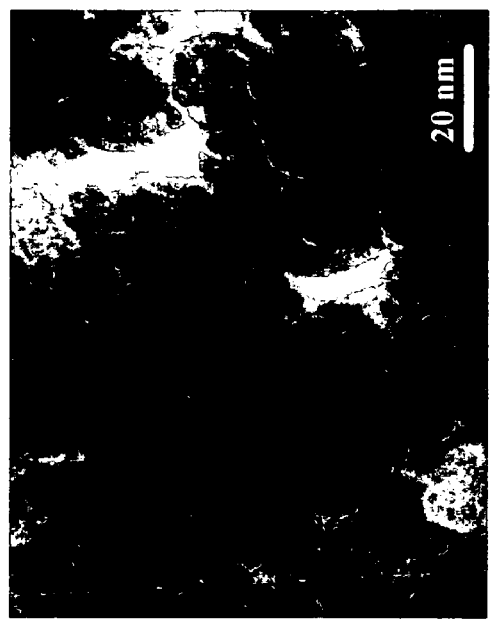
FIG. 14 is a TEM image of discrete 10 nanometer cobalt particles (dark field) dispersed in benzocyclobutane (bright field)

Cobalt carbonyl was reduced to a Co nanoparticle dispersion at 110° C. in toluene. The average particle size of the cobalt nanoparticles were about 10 nm. Addition of benzocyclobutene (BCB) into the Co/toluene mixture resulted in the BCB coating the Co particles. A thick paste was then obtained after evaporation of the toluene under an argon atmosphere. FIG. 14 is a TEM image of the paste after curing of the BCB at 250° C. for 1 hour using a heating rate of 1° C./min under nitrogen.

EXAMPLE 7

Formation of an Inductor Using Discrete Nanoparticles Paste

Figure 15:
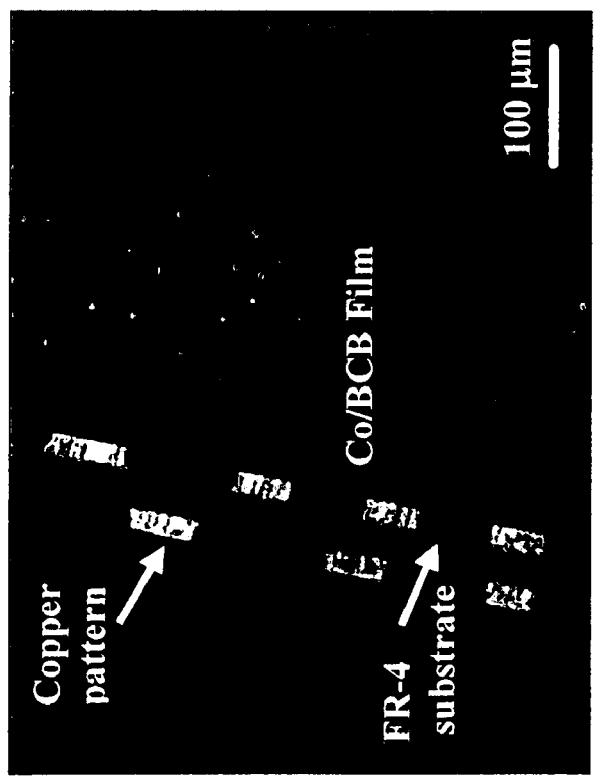
FIG. 15 is a representative optical microscope image of an inductor formed using a discrete nanoparticle paste.

The discrete Co nanoparticle paste of Example 6 was deposited onto a FR-4 printed circuit board via screen-printing or plotting, followed by curing of the BCB. FIG. 15 is a representative optical microscope image of an inductor, and illustrates the positional relationship between the substrate, thick film of Co, and the copper coil. Among the inductors that were fabricated, the bonding between the film and the patterned structure was excellent, and no delamination of the film from the substrate was observed.

Figure 16:
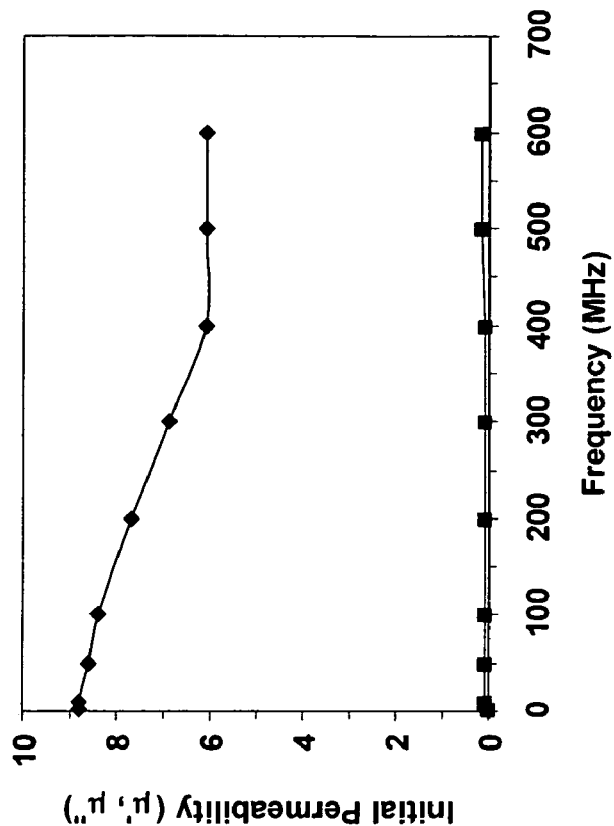
FIG. 16 is a graphical representation of the permeability as a function of frequency for an inductor made using a paste having about 90 weight percent cobalt nanoparticles.

The permeability of the inductors were measured from about 1 MHz to about 600 MHz. The inductors exhibited increased permeability of as a function of cobalt loading. With up to 90% cobalt loading, a permeability of about 6 was observed at about 600 MHz, as shown in FIG. 16. The top line in the graph represents μ', or the real component of the complex permeability, and is indicative of the softness of the magnetization process in an alternating magnetic field. The bottom line in the graph represents μ", or the imaginary component of the complex permeability, and is indicative of the loss of the energy in the magnetization process. It should be emphasized that for each sample, the eddy current losses were quite small, and the Q factor (which is represented by the quotient of μ' divided by μ") was greater than about 50 throughout the entire frequency range.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:
1. A magnetic paste, comprising:
a magnetic component and a liquid organic component, wherein the magnetic component comprises a plurality of discrete nanoparticles, a plurality of nanoparticle-containing assemblies, or both, wherein each assembly of the plurality of nanoparticle-containing assemblies has an average longest dimension of about 0.5 to about 150 micrometers, wherein the magnetic component comprises two or more different sized groups of assemblies or discrete nanoparticles.

2. The magnetic paste of claim 1, wherein an assembly of the plurality of nanoparticle-containing assemblies is a solid composite comprising a plurality of separate conductive nanoparticles dispersed in an insulating matrix.

3. The magnetic paste of claim 2, wherein a nanoparticle-nanoparticle separation distance is about 1 to about 100 nanometers.

4. The magnetic paste of claim 2, wherein the insulating matrix comprises a high dielectric material.

5. The magnetic paste of claim 2, wherein at least a portion of the separate conductive nanoparticles is coated with an insulating composition.

6. The magnetic paste of claim 1, wherein an assembly of the plurality of nanoparticle-containing assemblies is a microscale particle comprising a plurality of agglomerated nanoparticles.

7. The magnetic paste of claim 1, wherein the liquid organic component is an epoxy, a polyimide, a polystyrene, ethyl cellulose, or benzocyclobutene.

8. The magnetic paste of claim 1, where the magnetic component comprises assemblies of three different sizes.

9. The magnetic paste of claim 1, wherein the magnetic component comprises greater than or equal to about 40 volume percent of the magnetic paste.

10. The magnetic paste of claim 1, wherein the magnetic component comprises about 40 to about 92 volume percent of the magnetic paste.

11. The magnetic paste of claim 1, wherein each assembly of the plurality of assemblies has a packing density greater than or equal to about 75 percent of a theoretical density.

12. The magnetic paste of claim 1, wherein each of the plurality of nanoparticle-containing assemblies are in direct contact with an other of the plurality of nanoparticle-containing assemblies.

13. The magnetic paste of claim 1, wherein each of the plurality of discrete nanoparticles has a nanoparticle-nanoparticle separation distance of about 1 to about 100 nanometers.

14. The magnetic paste of claim 1, wherein the magnetic component comprises two different sized groups of discrete nanoparticles and wherein the size of the nanoparticles in a second sized group to the size of the nanoparticles in a first size group is about 0.1:1 to about 0.8:1.

15. The magnetic paste of claim 1, wherein the magnetic component comprises three different sized groups of discrete nanoparticles, wherein the size the nanoparticles in a third sized group to the size of the nanoparticles in a second sized group is about 0.1:1 to about 0.8:1 and wherein the size of the nanoparticles in the second sized group to the size of the nanoparticles in a first sized group is about 0.1:1 to about 0.8:1.

* * * * *